(12) United States Patent
Yoshida et al.

(10) Patent No.: US 7,683,537 B2
(45) Date of Patent: Mar. 23, 2010

(54) ORGANIC EL DEVICE AND DISPLAY

(75) Inventors: Hidehiro Yoshida, Osaka (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/302,530

(22) PCT Filed: May 21, 2008

(86) PCT No.: PCT/JP2008/001269

§ 371 (c)(1),
(2), (4) Date: Nov. 26, 2008

(87) PCT Pub. No.: WO2008/146470

PCT Pub. Date: Dec. 4, 2008

(65) Prior Publication Data

US 2009/0160322 A1   Jun. 25, 2009

(30) Foreign Application Priority Data

May 28, 2007 (JP) ............................ 2007-139861
May 29, 2007 (JP) ............................ 2007-141518

(51) Int. Cl.
*H01J 1/62* (2006.01)

(52) U.S. Cl. ........................................ 313/509; 313/292
(58) Field of Classification Search ......... 313/498–512, 313/292, 238, 268
See application file for complete search history.

(56) References Cited

U.S. PATENT DOCUMENTS

| 6,380,672 B1 | 4/2002 | Yudasaka |
| 6,614,174 B1 | 9/2003 | Urabe et al. |
| 6,948,993 B2 | 9/2005 | Yi et al. |

(Continued)

FOREIGN PATENT DOCUMENTS

EP  0940797  9/1999

(Continued)

OTHER PUBLICATIONS

English language Abstract of JP 11-040370 A.

(Continued)

*Primary Examiner*—Peter Macchiarolo
(74) *Attorney, Agent, or Firm*—Greenblum & Bernstein, P.L.C.

(57) ABSTRACT

An organic EL device that increases light emission efficiency by promoting the uniformity of light-emitting layer thickness while reducing the interval between pixel regions, and a display provided with the organic EL device. An organic EL device (10) has two or more first banks (230) extending in a line state, a plurality of second banks (240) that define pixel regions (300) by dividing a region between the adjacent first banks (230) and have a height lower than that of the first bank (230), a hole transport layer (250) provided independently for each pixel region (300), and an insulating inorganic film (220) provided on edges of the pixel region (300) along side faces of the two first banks (230) facing each other and defining the pixel regions (300). With the configuration, even if the interval between the pixel regions is small, a layer in contact with an upper face of the insulating inorganic film (220) is formed flat by the insulating inorganic film (220) and a layer thickness of the layer is made uniform.

7 Claims, 8 Drawing Sheets

U.S. PATENT DOCUMENTS

| | | |
|---|---|---|
| 7,122,956 B2 | 10/2006 | Ikeda et al. |
| 7,423,374 B2 * | 9/2008 | Okano .................. 313/509 |
| 7,453,208 B2 * | 11/2008 | Lin et al. ............... 313/292 |
| 7,477,014 B2 * | 1/2009 | Mitsuya ................ 313/504 |
| 2002/0016031 A1 | 2/2002 | Fujimori et al. |
| 2003/0211643 A1 | 11/2003 | Fujimori et al. |
| 2004/0090175 A1 | 5/2004 | Urabe et al. |
| 2006/0003266 A1 | 1/2006 | Yi et al. |
| 2006/0119258 A1 | 6/2006 | Sakata et al. |
| 2006/0197079 A1 | 9/2006 | Suh et al. |
| 2006/0284189 A1 | 12/2006 | Sakata et al. |
| 2007/0066179 A1 | 3/2007 | Nakamura et al. |
| 2007/0075618 A1 * | 4/2007 | Mitsuya ................ 313/292 |
| 2007/0200125 A1 | 8/2007 | Ikeda et al. |
| 2008/0036374 A1 | 2/2008 | Okano |
| 2008/0180421 A1 | 7/2008 | Yudasaka |
| 2009/0224664 A1 * | 9/2009 | Yoshida et al. ........ 313/504 |

FOREIGN PATENT DOCUMENTS

| | | |
|---|---|---|
| EP | 0989778 | 3/2000 |
| JP | 11-040370 A | 2/1999 |
| JP | 2000-089690 A | 3/2000 |
| JP | 2000-195668 A | 7/2000 |
| JP | 2001-148291 A | 5/2001 |
| JP | 2002-237383 A | 8/2002 |
| JP | 2003-100466 A | 4/2003 |
| JP | 2005-071656 A | 3/2005 |
| JP | 2005-259479 A | 9/2005 |
| JP | 2006-114477 A | 4/2006 |
| JP | 2006-164708 A | 6/2006 |
| JP | 2006-245582 A | 9/2006 |
| JP | 2007-019489 A | 1/2007 |
| JP | 2007-506227 A | 3/2007 |
| JP | 2007-087785 A | 4/2007 |
| JP | 2007-095521 | 4/2007 |
| JP | 2007-095614 A | 4/2007 |
| WO | 2006/054421 | 5/2006 |

OTHER PUBLICATIONS

English language Abstract of JP 2000-089690 A.
English language Abstract of JP 2003-100466 A.
English language Abstract of WO 2005/027584.
English language Abstract of JP 2007-087785 A.
English language Abstract of JP 2005-071656 A.
English language Abstract of JP 2006-245582 A.
U.S. Appl. No. 11/914,840 to Yoshida et al., which was filed on Nov. 19, 2007.
U.S. Appl. No. 12/126,363 to Nakatani et al., which was filed on May 23, 2008.
English language translation of JP 2007-095521, paragraphs [0021] to [0032].
Office Action of Japanese Patent Application No. JP JP2009-103446, dated Aug. 25, 2009.
Extended European Search Report, dated Oct. 9, 2009, issued with respect to corresponding European Patent Application No. 08751787.

* cited by examiner

ORGANIC EL DEVICE AND DISPLAY

TECHNICAL FIELD

The present invention relates to an organic EL device and a display provided with the organic EL device.

BACKGROUND ART

A display panel using an Organic Electro-Luminescence (OEL) device has been known.

A system for an OEL device that emits light is classified into two types: passive matrix method and active matrix method. The active matrix method is a drive system using a thin film transistor (TFT).

FIG. 1 is a diagram illustrating array of light-emitting element (passive type) of a conventional full-color organic display panel. As shown in this figure, the organic display panel has an image display arrangement including a plurality of light-emitting elements 41 arranged in a matrix state, and each light-emitting element 41 has light emitting parts of red R, green G, and blue B.

FIG. 2 is a diagram illustrating an outline structure of substrate section 51a of light-emitting element 41 of the full-color organic display panel (passive type). As shown in this figure, substrate section 51a has first electrodes 53 made of indium/tin oxide (ITO) and the like provided on substrate 52 made of transparent glass and the like. Plural first electrodes 53 are arranged in a stripe state in parallel with each other. In addition, electrical insulating films 54 and banks 55 are set on substrate 52 including first electrodes 53. Insulating films 54 and banks 55 are formed so as to cross first electrodes 53 at a right angle and with a predetermined interval. Further, banks 55 are provided so as to project from substrate 52. Furthermore, banks 55 are formed at positions so as to expose part of first electrodes 53.

In addition, on a part of electrode 53 on which the banks are not formed, at least one layer of OEL layer 56 is formed. Further, on OEL layer 56, second electrode 57 extending substantially perpendicular to an extending direction of first electrode 53.

Banks 55 prevents adjacent second electrodes 57 from shorting out by separating adjacent second electrodes 57 from each other. Therefore, a sectional shape of bank 55 is preferably in an overhang shape such as an inverted trapezoid and the like as shown in FIG. 2.

Moreover, an organic material constituting OEL layer 56 is susceptible to moisture in general, and a material susceptible to moisture is used also in a material constituting banks 55. Thus, in light-emitting element 41, a surface on which banks 55 and OEL layer 56 are formed is sealed by a sealing section (such as a glass tube, a protective film and the like, for example) as shown in FIG. 3. FIG. 3 is a sectional view illustrating a structure of light-emitting element in a conventional full-color organic display panel, in which FIG. 3A shows light-emitting element 41 sealed by glass tube 68, FIG. 3B shows light-emitting element 41 sealed by protective film 69 with a low moisture permeability. Both FIGS. 3A and 3B are sectional views along a longitudinal direction of first electrode 53.

In light-emitting element 41 configured as above, OEL layer 56 at a part where first electrode 53 and second electrode 57 cross each other at a right angle while being driven emits light. The emitted light transmits substrate 52 and proceeds toward a display surface direction (See Patent Documents 1 and 2, for example).

Patent Document 1: Japanese Patent Application Laid-Open No. H11-040370
Patent Document 2: Japanese Patent Application Laid-Open No. 2000-089690

DISCLOSURE OF THE INVENTION

Problems to be Solved by the Invention

In the recent research/development of OEL display panels and OEL display, increase of light-emission brightness is one of important objects. In the technical field of the OEL display panel and OEL display, various methods for increasing brightness have been proposed. However, there is no decisive solution to drastically increase brightness, and the brightness has been increased little by little through accumulation of improvements at present.

In general, enlarging a light-emitting area in a light-emitting surface is one of factors to increase brightness. That is, by enlarging the light-emitting area in the light-emitting surface, a hole and an electron fed from both electrodes to the light-emitting surface recombine efficiently, which increases light-emitting efficiency.

However, with the above-mentioned conventional light-emitting element, an interval between the pixel regions, which are overlap regions of the both electrodes, is large, and there is a loss in the light-emitting area. If the interval between the pixel regions is reduced in the above-mentioned conventional light-emitting element configuration in order to reduce the loss in the light-emitting area, interference between the pixel regions may occur.

As a method of solving contradicting problems of the loss in the light-emitting area and the interference between the pixel regions, a method of providing a second bank defining the pixel regions is known.

However, it is difficult to flatten the light-emitting layer in the vicinity of the bank, and therefore the bank causes non-uniformity of a thickness of the light-emitting layer. This non-uniformity of the light-emitting layer thickness negatively contributes to the light-emitting efficiency. If the interval between the pixel regions is enlarged in order to solve this problem, the loss in the light-emitting area occurs as mentioned above.

The present invention has an object to provide an OEL device and a display that can increase light-emitting efficiency by providing a pixel defining layer (insulating inorganic film) around the bottom face of the bank so as to reduce an interval between pixel regions and to promote uniformity of the light-emitting layer thickness.

Means for Solving the Problems

The OEL device of the present invention is composed of two or more first banks extending in a line state, a plurality of second banks with a height lower than that of the first bank and defining a pixel region by dividing a region between the adjacent first banks, a hole transport layer provided independently for each pixel region, and an insulating inorganic film provided on edges of the pixel region, which edges extend along the side faces of the two first banks facing each other and defining the pixel regions.

Effect of the Invention

According to the present invention, by providing the pixel defining layer (insulating inorganic film) around the bottom face of the bank so as to reduce the interval between the pixel regions and to promote uniformity of the light-emitting layer thickness, an OEL device and a display with increased light-emitting efficiency is provided.

BEST MODE FOR CARRYING OUT THE INVENTION

Figure 1:
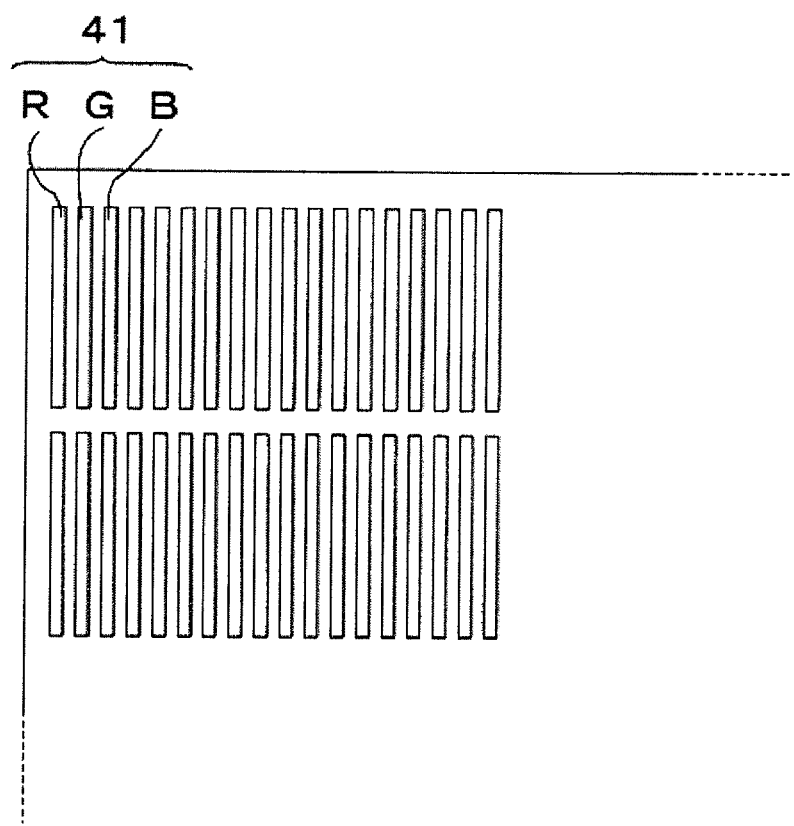
FIG. 1 is a diagram illustrating array of light-emitting element of a conventional full-color organic display panel.
Figure 2:
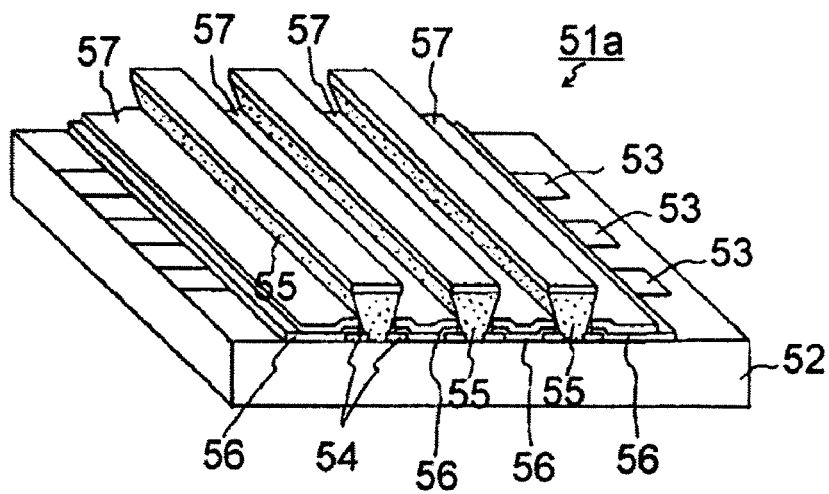
FIG. 2 is a diagram illustrating an outline structure of a substrate section of the light-emitting element of the conventional full-color organic display panel.
Figure 3A:
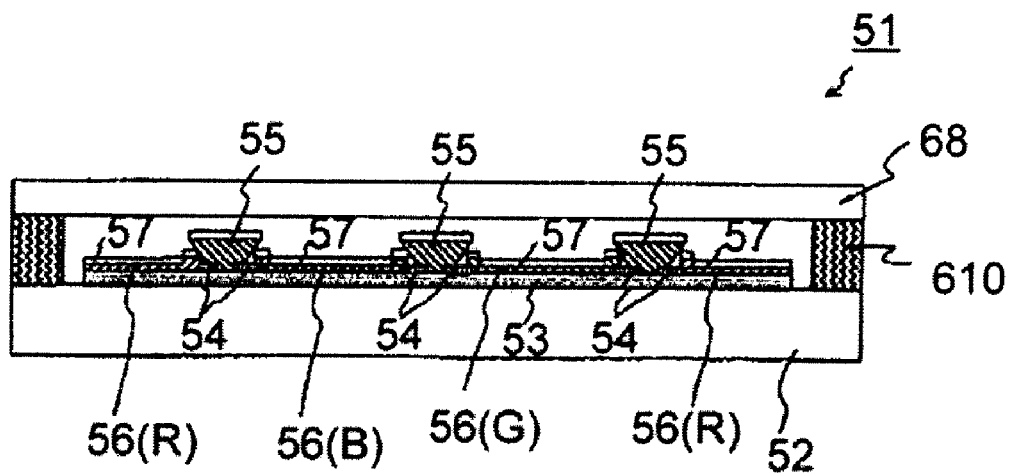
FIG. 3 are sectional views illustrating a structure of the light-emitting element of the conventional full-color organic display panel.
Figure 3B:
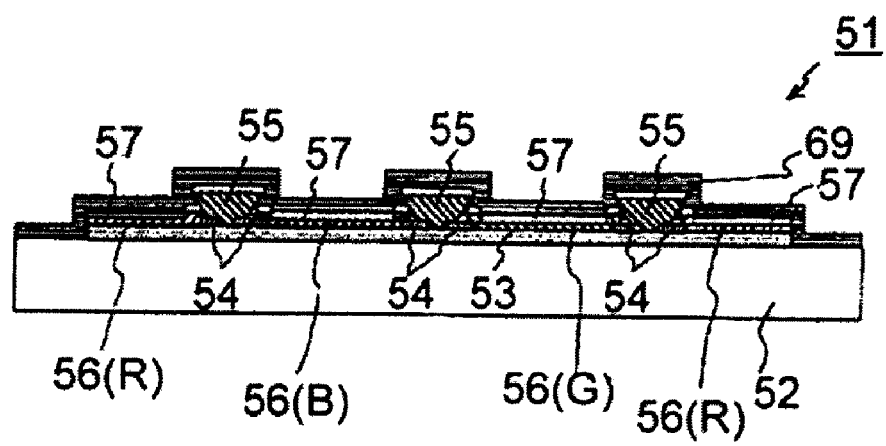

The OEL device according to an embodiment of the present invention which will be described below in detail referring to the attached drawings has 1) two or more first banks extending in a line state; 2) a plurality of second banks defining pixel regions by dividing a region between adjacent first banks and having a height lower than that of the first bank; 3) a hole transport layer provided independently for each pixel region; and 4) an insulating inorganic film provided on edges of the pixel region, which edges extend along side faces of the two first banks facing each other and defining the pixel regions.

In addition, it is preferable that the OEL device further has an insulating inorganic film provided on edges of the pixel region, which edges extend along the side faces of the two second banks facing each other and defining the pixel regions.

By an function of the inorganic insulating film, even if a distance between the opposing banks is reduced, the hole transport layer or an interlayer formed by an application method is formed with a uniform thickness over the entire pixel region. That is, by the function of the inorganic insulating film, the interval between the pixel regions is reduced, while the thickness of a light-emitting layer is made uniform.

In Embodiment 1 which will be described later, a case in which a material of the hole transport layer includes PSS-PEDOT (polyethylenedioxythiophene doped with polystyrene sulfonic acid, hereinafter abbreviated as PEDOT) or a derivative thereof (copolymer and the like) will be described. In Embodiment 1, the thickness of the hole transport layer is made uniform over the entire pixel region by the function of the inorganic insulating film.

In Embodiment 2, a case will be described in which a material of the hole transport layer is a metal oxide such as $WO_x$ (tungsten oxide), $MoO_x$ (molybdenum oxide), $VO_x$ (vanadium oxide) and the like or the combination of them. In Embodiment 2, the thickness of the interlayer is made uniform over the entire pixel region by the function of the inorganic insulating film.

In Embodiment 3, a case will be described in which a groove for connecting adjacent pixel regions with each other is provided at a second bank.

In Embodiment 4, a case will be particularly described in which a drive system of an OEL device is a passive system.

In Embodiment 5, a variation of a sectional shape of the bank will be described.

It should be noted that in Embodiments, the same reference numerals are given to the same components and duplicated explanations will be omitted.

Embodiment 1

[1. Basic Configuration of OEL Device]

Figure 4:
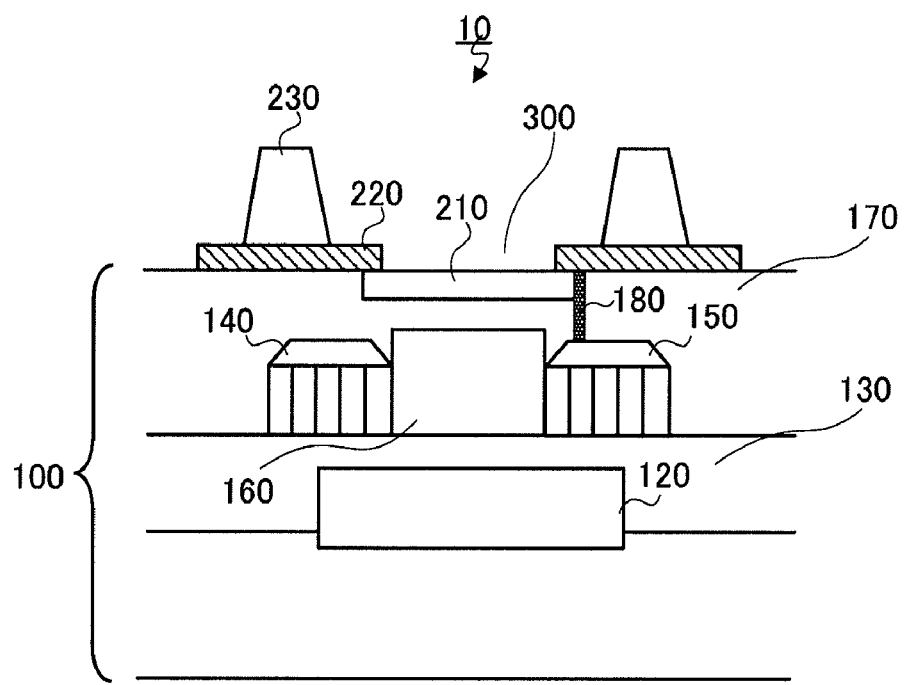
FIG. 4 is a sectional view illustrating basic configuration of an OEL device according to Embodiment 1 of the present invention.
Figure 5:
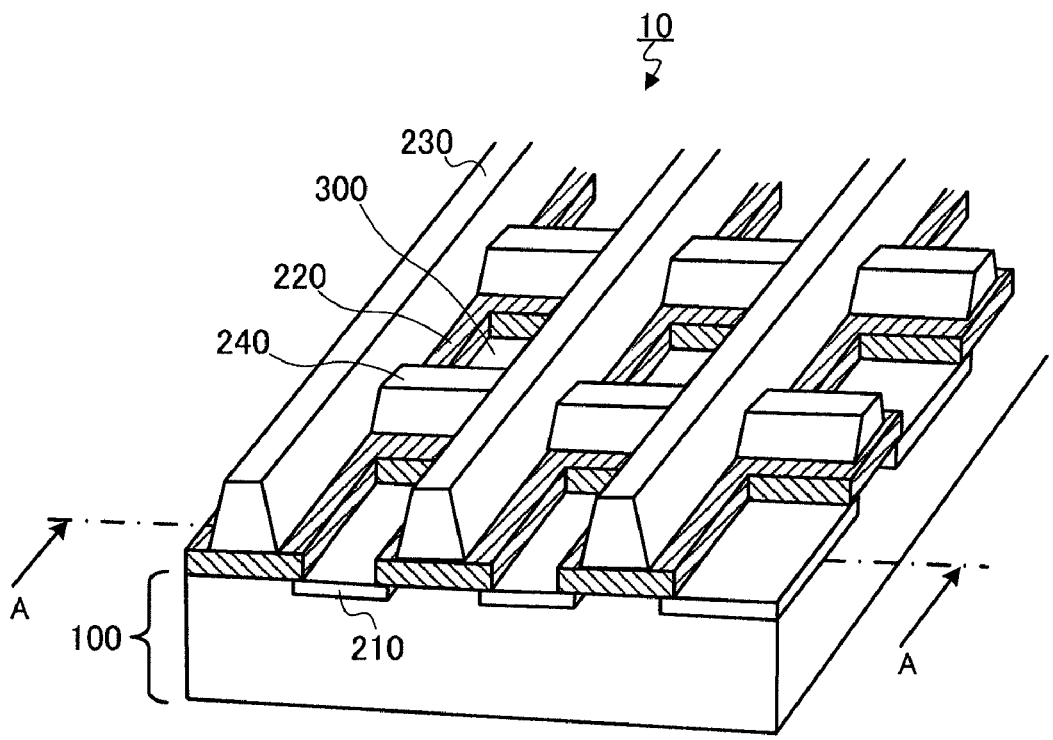
FIG. 5 is a perspective view illustrating the basic configuration of the OEL device according to Embodiment 1.

FIG. 4 is a sectional view illustrating a basic configuration of an OEL device according to Embodiment 1 of the present invention. FIG. 5 is a perspective view illustrating the basic configuration of the OEL device. FIG. 4 is a sectional view when the OEL device is cut off by A-A plane in FIG. 5. In FIGS. 4 and 5, hole transport layer, interlayer (IL), organic light-emitting layer (polymer OEL material layer), and cathode electrode are not shown.

In FIG. 4, OEL device 10 has substrate 100, anode electrode 210, insulating inorganic film 220, first bank (bank) 230, and second bank 240 (See FIG. 5). OEL device 10 is an OEL device with an active drive system.

Substrate 100 has gate electrode 120, gate insulating layer 130, source electrode 140, drain electrode 150, organic semiconductor layer 160, and insulating layer 170. Among them, gate electrode 120, gate insulating layer 130, source electrode 140, drain electrode 150, and organic semiconductor layer 160 constitute an organic TFT (thin film transistor). The organic TFT may be replaced by a silicon TFT.

In addition, contact hole 180 is provided on substrate 100. Contact hole 180 electrically connects drain electrode 150 to anode 210 provided on substrate 100. A contact point between contact hole 180 and anode 210 is set below insulating inorganic film 220.

Further, insulating inorganic film 220 is set on substrate 100. Insulating inorganic film 220 is set below first bank 230 and along the both sides of first bank 230. A width of insulating inorganic film 220 set along both sides of first bank 230 is preferably 5 to 10 μm. And besides, insulating inorganic film 220 is an electrically insulating inorganic film. Insulating inorganic film 220 preferably has high hydrophilicity, and the material thereof includes silicon oxide ($SiO_2$), silicon nitride ($Si_3N_4$), silicon oxynitride (SiON) and the like. A thickness of insulating inorganic film 220 is preferably 10 to 200 nm.

Next, basic configuration on substrate 100 in OEL device 10 will be described in detail.

As shown in FIG. 5, on substrate 100 of OEL device 10, a plurality of first banks 230 extending in a line state are arranged. Here, the plurality of first banks 230 extend in parallel with each other.

In addition, a plurality of second banks 240 with a height lower than that of first bank 230 are set on substrate 100. Second banks 240 are disposed so as to divide a region between adjacent first banks 230 into a plurality of regions. Here, the plurality of second banks 240 are set in a direction perpendicular to the extending direction of first banks 230. Thus, the plurality of regions 300 surrounded by two first banks 230 and two second banks 240 (hereinafter might be referred to as "pixel region") is formed on substrate 100. Pixel region 300 corresponds to a pixel.

Below a face of first bank 230 facing substrate 100 (that is, bottom face of first bank 230), insulating inorganic film 220 is set. In addition, insulating inorganic film 220 is set around the bottom face of first bank 230, specifically, on both edges of pixel region 300, which edges extend along each of the side faces of two first banks 230 facing each other and defining pixel regions 300. Further, an upper face of insulating inorganic film 220 (flat face, here) has one of the ends thereof in contact with the side face of first bank 230 and insulating inorganic film 220 protrudes toward inside of pixel region 300 from the side face. Furthermore, the height of insulating inorganic film 220 is lower than the height of second bank 240. Here, insulating inorganic film 220 is set around the bottom face of first bank 230, particularly around the bottom face of first bank 230 and below the bottom face of first bank 230. And as mentioned above, insulating inorganic film 220 preferably protrudes 5 to 10 μm towards the pixel region from the side face of first bank 230.

In addition, insulating inorganic film 220 is also set below the bottom face of second bank 240. Further, insulating inorganic film 220 is set around the bottom face of second bank 240, specifically, on the other two edges of pixel region 300, which edges extend along each of the side faces of two second banks 240 facing each other and defining pixel regions 300. The upper face of insulating inorganic film 220 (flat face, here) has one of the ends thereof in contact with the side face of second bank 240 and insulating inorganic film 220 protrudes toward inside of pixel region 300 from the side face. The height of insulating inorganic film 220 is lower than the height of second bank 240. Here, insulating inorganic film 220 is set around the bottom face of second bank 240, particularly around the bottom face and below the bottom face of second bank 240.

On the bottom face of each pixel region 300, anode 210 is set. OEL device 10 is an OEL device of an active drive system, and anode 210 is provided independently for each pixel.

[2. Details of Configuration of OEL Device]

In pixel region 300, a hole transport layer, an interlayer, a polymer OEL material layer are laminated from the substrate 100 side in this order.

(1) Hole Transport Layer

On anode 210, a hole transport layer is set. The hole transport layer is a layer made of a hole transport material. In the present embodiment, the hole transport material includes PEDOT and a derivative thereof (co-polymers and the like). A thickness of the hole transport layer is usually 10 nm or more and 100 nm or less and may be approximately 30 nm.

Figure 6:
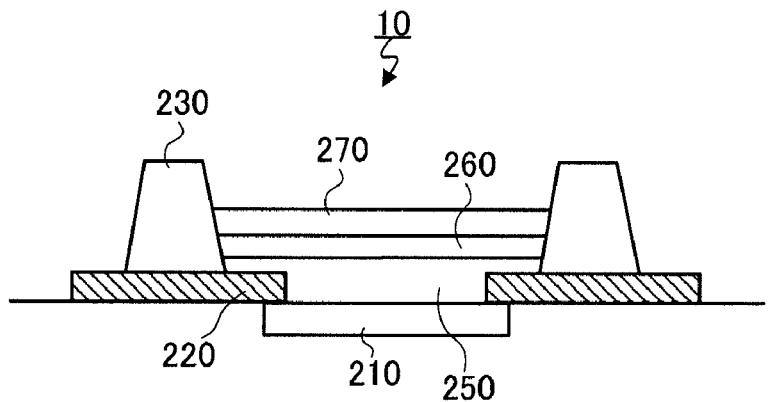
FIG. 6 is a sectional view of the OEL device having an insulating inorganic film under a hole transport layer.

FIG. 6 is a sectional view of the OEL device having an insulating inorganic film below the hole transport layer. As shown in FIG. 6, if the material of hole transport layer 250 is PEDOT (or a derivative thereof), hole transport layer 250 is provided in pixel region 300 so as to cover the upper face of insulating inorganic film 220. That is, in this case, a bottom face of hole transport layer 250 in the vicinity of the bank is in contact with an upper face of insulating inorganic film 220. By means of insulating inorganic film 220 provided around the bottom face of the bank and below the bottom face of the bank as above, a solution in which the material of hole transport layer 250 is dissolved is applied over the entire pixel region 300 uniformly so that hole transport layer 250 with a uniform thickness may be obtained.

(2) Interlayer on hole transport layer 250, interlayer 260 is set (See FIG. 6). Interlayer 260 has a role to block transportation of electron to hole transport layer 250 and a role to efficiently transport a hole to the polymer OEL material layer and is a layer made of a polyaniline material, for example. A thickness of interlayer 260 is usually 10 nm or more and 100 nm or less and may be approximately 40 nm.

(3) OEL Layer

Polymer OEL material layer 270 is set on interlayer 260 (See FIG. 6). In addition, on polymer OEL material layer 270, a cathode electrode (not shown) is set.

[3. Production Method of OEL Device]

Next, a production method of OEL device 10 having the above configuration will be described. Note that, since a production method of substrate 100 is not different from a conventional one, the description will be omitted.

An example of a preferred production method includes steps of 1) forming anode 210 on a substrate face; 2) forming insulating inorganic film 220 on a substrate face on which anode 210 is formed; 3) forming first bank 230 and second bank 240 defining pixel region 300 on insulating inorganic film 220; 4) forming hole transport layer 250 in pixel region 300; 5) forming interlayer 260 in pixel region 300; 6) forming polymer OEL material layer 270 in pixel region 300; and 7) forming a cathode on polymer OEL material layer 270.

In the 1) step, anode 210 is formed on substrate 100 by forming a conducting thin film on a substrate, and subjecting the conducting thin film to photolithographic treatment or etching treatment. Anode 210 is formed independently for each pixel region 300 at a position where pixel region 300 will be formed.

In the 2) step, insulating inorganic film 220 is formed on substrate 100 by sputtering. Insulating inorganic film 220 may be directly formed at a predetermined position by sputtering through mask or may be formed by leaving a sputtering film only at the predetermined position by etching.

In the 3) step, on insulating inorganic film 220, first bank 230 and second bank 240 defining pixel region 300 are formed. A method of forming the banks will be described later in detail.

In the 4) step, thus formed pixel region 300 is coated with a solution in which PEDOT and the like are dissolved. The solution is applied by ink-jet, letterpress printing, intaglio printing or dispenser method, for example.

In the 5) step, an upper layer of hole transport layer 250 within pixel region 300 is coated with a solution including a material of interlayer 260 and an organic solvent. The coating is applied by ink-jet, letterpress printing, intaglio printing or dispenser method, for example.

In the 6) step, the upper layer of interlayer 260 within pixel region 300 is coated with a solution including a material of polymer OEL material layer 270 and an organic solvent. The solution is applied by ink-jet, for example.

In the 7) step, a cathode is formed on polymer OEL material layer 270.

Here, formation of first bank 230 and second bank 240 in the 3) step may be carried out by a method mentioned below.

Figure 7:
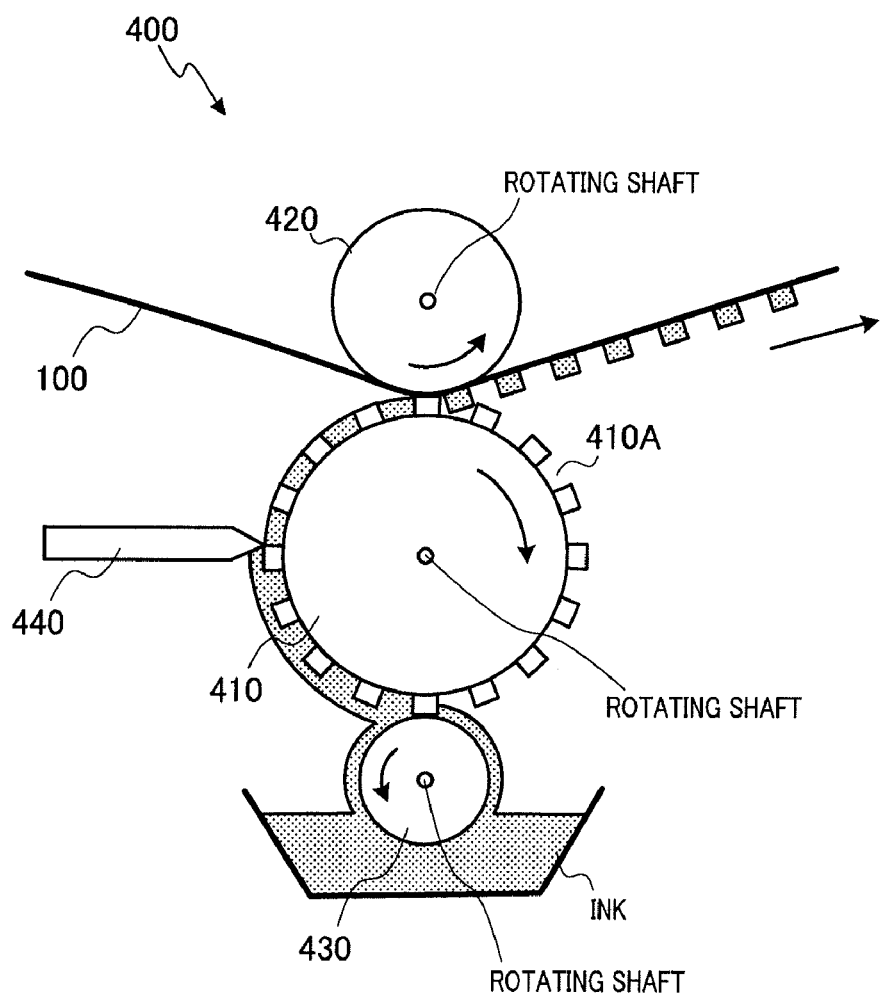
FIG. 7 is a view for explaining a bank forming method by gravure printing method.

Firstly, as a first forming method, first banks 230 and second banks 240 are formed by gravure printing process (See FIG. 7). FIG. 7 is a diagram for explaining a bank forming method by the gravure printing process. FIG. 7 shows configuration of gravure printing device 400 with which banks are formed.

First, printing roll 410, impression cylinder roll 420, and supply roll 430 placed in a tank (without reference numeral) in which ink (constituent material of bank) is stored are rotated, respectively.

The lower part of supply roll 430 is dipped in ink, and the ink adhering to the surface of the lower part is supplied to printing roll 410 by rotation.

On roll surface 410A of printing roll 410, a recess section is provided. In the recess section, the ink supplied by supply roll 430 is filled. Since a thickness of the ink filled in the recess section is varied, the thickness of the ink is made uniform by doctor 440.

The ink filled in the recess section is transferred to substrate 100 in press contact with printing roll 410 by impression cylinder roll 420. A patterned bank according to a pattern of the recess section in printing roll surface 410A is formed as above.

Next, substrate 100 is rotated by 90 degrees, for example, and roll surface 410A of printing roll 410 is replaced by that for second bank 240 and then, similarly to the formation of first bank 230, second bank 240 is formed. Pixel region 300 surrounded by first bank 230 and second bank 240 is formed on substrate 100 as above. Note that, before carrying out the step (4), a resin material constituting first bank 230 may be cured by pre-bake treatment to patterned first bank 230.

Further, as a second forming method, a photolithography method mentioned below may be used.

First, on a line including a position where second bank 240 will be formed, a raw material for constituting second bank 240 is applied. The applied raw material is subjected to pre-bake, exposed through photo-mask, subjected to development and then post-bake in this order to form second bank 240.

Next, similarly to the forming method of second bank 240, on a line including a position where first bank 230 is formed, a raw material for constituting first bank 230 is applied. The applied raw material is subjected to pre-bake, exposed through photo-mask, subjected to development and then post-bake in this order to form first bank 230.

Moreover, as a third forming method, after a bank material is applied at a position where first bank 230 and second bank 240 are scheduled to be formed, first bank 230 and second bank 240 may be formed at the same time by carrying out pre-bake, exposure, development and post-bake in this order. At this time, as the photo-mask used for exposure, a half-tone film having light permeability with different rates depending on the location may be used. By this means, by adjusting a light amount irradiated to the position where first bank 230 is formed and to the position where second bank 240 is formed, first bank 230 and second bank 240 with different heights are formed in the same step.

As explained above, according to the present embodiment, in OEL device 10, insulating inorganic film 220 is set on the edge of pixel region 300, which edge extends along the side face of first bank 230 facing pixel region 300. In other words, insulating inorganic film 220 is provided so as to protrude into pixel region 300 from first bank 230.

In this way, the layer-thickness uniformity of hole transport layer 250 can be increased.

That is, it is usually difficult to flatten a layer to be applied in the vicinity of the bank. However, by providing insulating inorganic film 220 with hydrophilicity higher than that of an organic material around the bottom face of first bank 230, a layer in contact with the upper face of insulating inorganic film 220 (hole transport layer 250 in the present embodiment) is formed flat and the layer-thickness uniformity of the layer can be increased. As a result, the layer-thickness uniformity in the vicinity of first bank 230 (layer-thickness uniformity of hole transport layer 250, interlayer 260, and polymer OEL material layer 270) is increased.

Here, a portion where the layer-thickness uniformity is not maintained is known to negatively affect light-emitting efficiency. Thus, by increasing the layer-thickness uniformity of a layer formed in pixel region 300, brightness of pixel region 300 is increased.

Further, in OEL device 10, a contact point between contact hole 180 and anode 210 is set at below insulating inorganic film 220.

As a result, a hole injected from contact hole 180 is prevented from directly intruding into polymer OEL material layer 270. As a result, a spot where light emission should be prevented as in a contact hole is prevented from emitting light.

Here, OEL device 10 according to the present embodiment has second bank 240 in addition to first bank 230 as compared with the conventional art described above. Second bank 240 has a function to separate adjacent pixel regions from each other and prevents excitation occurring at an organic light-emitting layer of a first pixel region and light energy generated by the excitation from leaking into the second pixel region adjacent to the first pixel region. In addition, by choosing the color of the bank (black, for example) having high contrast with the light emitted from the pixel region, leakage prevention effect of light energy is further increased.

Therefore, if an auxiliary bank (corresponding to the second bank in the present embodiment) partitioning adjacent pixel regions is not present as in conventional art, a gap between anodes (that is, a gap between pixel regions) is required to be taken larger, while on the other hand, in OEL device 10, a gap between anodes 210 (that is, a gap between pixel regions 300) is smaller. As a result, a space between anodes 210 is made small and a gap between two pixels is reduced, and at the same time, an area for pixel region 300 in the entire OEL device 10 is increased.

However, if a distance between second banks 240 is made small with the reduction of the gap between pixel regions 300, the layer thickness of a layer formed in pixel region 300 by an application method becomes non-uniform. This is a factor to lower the light emission efficiency of OEL device 10. That is, second bank 240 itself could be a disincentive to reduce the gap between pixel regions 300.

On the other hand, in the present embodiment, as mentioned above, insulating inorganic film 220 is set on the edge of pixel region 300, which edge extends along the side face of second bank 240. In other words, insulating inorganic film 220 is provided protruding into pixel region 300 from second bank 240.

With the arrangement, even if a distance between second banks 240 is small, a layer to be formed in pixel region 300 by the application method is formed with a uniform layer thickness.

That is, in OEL device 10, by providing insulating inorganic layer 220 on the edge of pixel region 300, which edge extends along the side face of second bank 240, a layer thickness of a layer in contact with the upper face of insulating inorganic film 220 is made uniform while a gap between anodes 210 (that is, a gap between pixel regions 300) is reduced.

Further, second bank 240 facilitates the independent provision of hole transport layer 250, interlayer 260, and polymer OEL material layer 270 for each pixel region 300.

Further, second bank 240 itself increases layer-thickness uniformity of interlayer 260 and polymer OEL material layer 270 in a sense. That is, if there is an impurity such as a dust and the like is present in pixel region, for example, when there is no auxiliary bank (corresponding to the second bank in the present embodiment) partitioning adjacent pixel regions as in conventional art, an organic solvent solution used for formation of the interlayer or the polymer OEL layer is attracted to the impurity, which causes non-uniform layer thickness of the interlayer or the polymer OEL layer. On the other hand, by providing second bank 240 as in the present embodiment, the organic solvent solution applied on the first pixel region is prevented from being attracted by the second pixel region where the impurity is present and adjacent to the first pixel region.

Furthermore, the height of second bank 240 is set lower than the height of first bank 230 as mentioned above. The height of second bank 240 is preferably 1/10 to 9/10 of the height of first bank 230. As a result, a hole and an electron injected from anode 210 and the cathode, respectively, recombine efficiently on polymer OEL material layer 270, therefore, high brightness is obtained and a function to separate adjacent pixel regions 310 described above is exerted. Moreover, by having the bank height as in described above, formation of an organic light-emitting layer is facilitated, which is a merit also from the viewpoint of production processes.

On the other hand, if the height of second bank 240 is set smaller than 1/10 of the height of first bank 230, for example, a constituent material of the organic light-emitting layer (OEL material) becomes easier to adhere to the side face of second bank 240. As a result, there is a higher possibility that layer-thickness distribution of the organic light-emitting layer becomes non-uniform, and it becomes difficult to increase the brightness. On the other hand, by setting the height of second bank 240 larger than 9/10 of the height of first bank 230, the constituent material of the organic light-emitting layer becomes easy to overflow into another line over first bank 230, and there is a high possibility that the cross-talk between two lines occurs.

More preferably, the height of second bank 240 is 1/5 to 1/3 of the height of first bank 230. Particularly, if a polymer organic material is used as a constituent material of the organic light-emitting layer, since ink concentration to be applied is approximately 1%, which has a low viscosity, it easily leaks out to another line over first bank 230. Therefore, the height of first bank 230 is preferably sufficiently higher than that of second bank 240.

It should be noted that, the phrase "1/10 to 9/10" means "1/10 or more and 9/10 or less". That is, supposing that the height of first bank 240 is d1 and the height of second bank 230 is d2, the phrase means that the relation d1/10≦d2≦9×d1/10 can be satisfied.

A material constituting the bank is not particularly limited but an organic material such as polyacrylate, polyimide or the like may be used, for example. However, from the viewpoint of production processes, and since there is a merit that a gas is not generated during bake, polyimide is the preferable material.

In addition, the organic materials constituting first bank 230 and second bank 240 may be different from each other. That is, first bank 230 has a role to prevent adjacent pixel regions 300 from interfering with each other, placing first bank 230 between adjacent pixel regions 300. Therefore, first bank 230 is preferably constituted by a material with low hydrophilicity so that the ink does not flow over first bank 230 into adjacent pixel region 300. Therefore, first bank 230 may be constituted by a material with low hydrophilicity, while second bank 240 may be constituted by a material with hydrophilicity higher than that of first bank 230. A water-contact angle on the surface of first bank 230 is preferably 40 degrees or more, while the water-contact angle on the surface of second bank 240 is preferably 20 degrees or less. That is, a difference in the water-contact angles on the surfaces between first bank 230 and second bank 240 is preferably 20 degrees or more.

Further, the sectional shape of the bank is trapezoidal in FIGS. 4 to 7, but not limited to that, it may be rectangular. Further, each side of the cross-section of the bank does not have to be a straight line but may be a curved line.

Embodiment 2

In Embodiment 2, a case where a material of the hole transport layer is a metal oxide such as $WO_x$ (tungsten oxide), $MoO_x$ (molybdenum oxide), $VO_x$ (vanadium oxide) and the like or a combination of them will be described.

[1. Basic Configuration of OEL Device]

Basic configuration of an OEL device according to Embodiment 2 is the same as the basic configuration of Embodiment 1 shown in FIGS. 4 and 5. That is, an insulating inorganic film is set around the bottom face of the first bank, specifically, on the edges of a pixel region, which edges extend along each of the side faces of two first banks facing each other and defining the pixel regions. In addition, the insulating inorganic film is set around the bottom face of the second bank, specifically, on the edges of the pixel region, which edges extend along each of the side faces of two second banks facing each other and defining the pixel regions.

[2. Details of Configuration of OEL Device]

Figure 8:
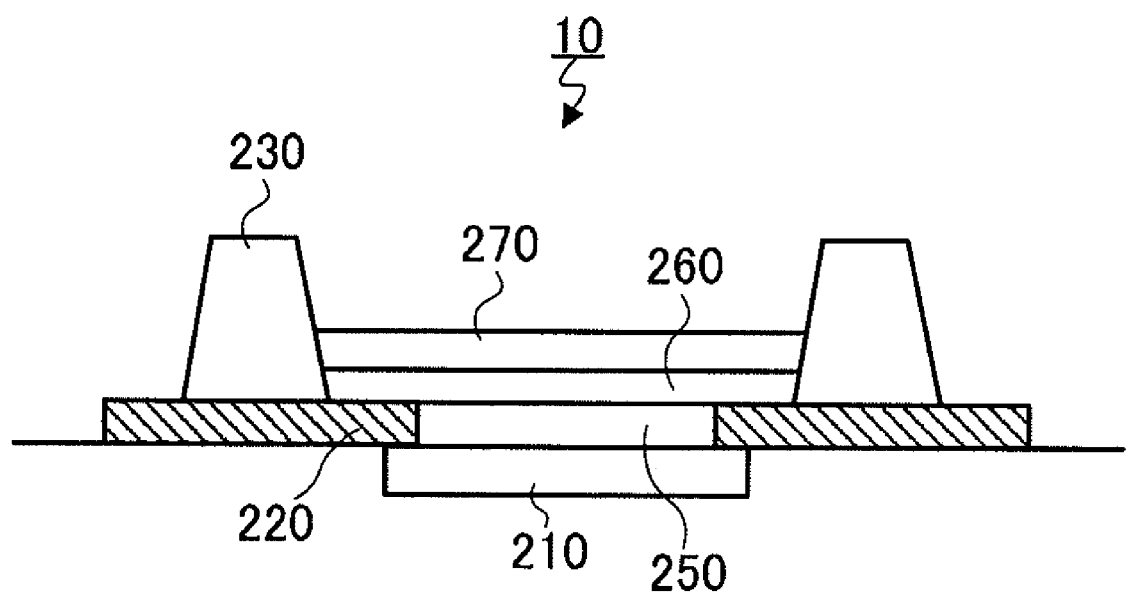
FIG. 8 is a sectional view of the OEL device according to Embodiment 2.

Similar to the case in FIG. 6, in pixel region 300, a hole transport layer, an interlayer, a polymer OEL material layer are laminated in this order from substrate 100 side (See FIG. 8). FIG. 8 is a sectional view of an OEL device having an insulating inorganic film under the interlayer.

(1) Hole Transport Layer

If the material of hole transport layer 250 is a metal oxide such as $WO_x$ (tungsten oxide), $MoO_x$ (molybdenum oxide), $VO_x$ (vanadium oxide) and the like or a combination of them, hole transport layer 250 does not cover an upper face (or at least a portion located in the vicinity of the bank in the entire upper face) of insulating inorganic film 220. That is, before the interlayer is formed, the upper face (or at least a portion located in the vicinity of the bank in the entire upper face) of insulating inorganic film 220 is not covered by hole transport layer 250 but exposed.

(2) Interlayer

Interlayer 260 is set on hole transport layer 250 (See FIG. 8). Here, in a stage where interlayer 260 is formed, since the upper face of insulating inorganic film 220 is exposed, a bottom face of interlayer 260 is brought into contact with the upper face of insulating inorganic film 220 in the vicinity of the bank. Thus, by insulating inorganic film 220 provided around the bottom face the bank, a solution in which a material of interlayer 260 is dissolved is applied on the entire pixel region 300 uniformly, and interlayer 260 with a uniform film thickness is obtained.

(3) OEL Layer

Polymer OEL material layer 270 is set on interlayer 260 (See FIG. 8). Further, on polymer OEL material layer 270, a cathode electrode (not shown) is set.

[3. Production Method of OEL Device]

An example of a preferred production method includes steps of 1) forming anode 210 on a substrate face; 2) forming hole transport layer 250 on anode 210; 3) forming insulating inorganic film 220 on a substrate face; 4) forming first bank 230 and second bank 240 defining pixel region 300 on insulating inorganic film 220; 5) forming interlayer 260 in pixel region 300; 6) forming polymer OEL material layer 270 in pixel region 300; and 7) forming a cathode on polymer OEL material layer 270.

The same methods as shown in Embodiment 1 may be used as methods of forming anode 210, insulating inorganic film 220, interlayer 260, polymer OEL material layer 270, and the cathode.

In the step 2), hole transport layer 250 is formed on anode 210. Here, hole transport layer 250 is formed by a heating deposition method or a sputtering method, for example.

Figure 9A:
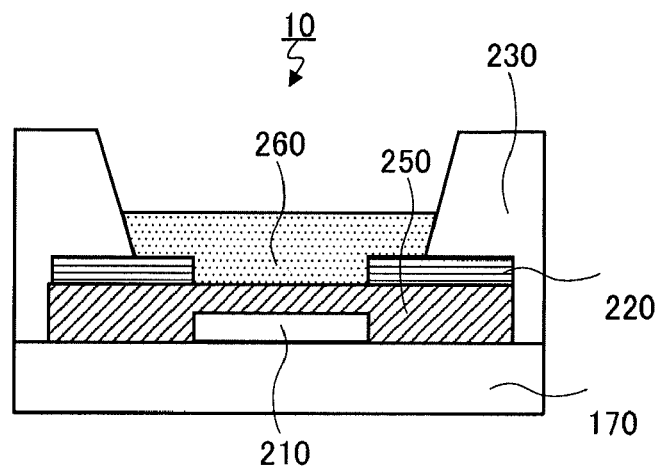
FIG. 9 are diagrams illustrating a configuration variation of the OEL device.
Figure 9B:
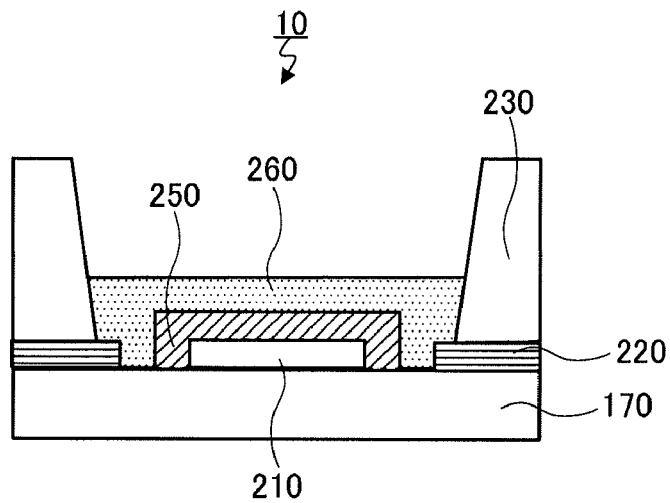
Figure 9C:
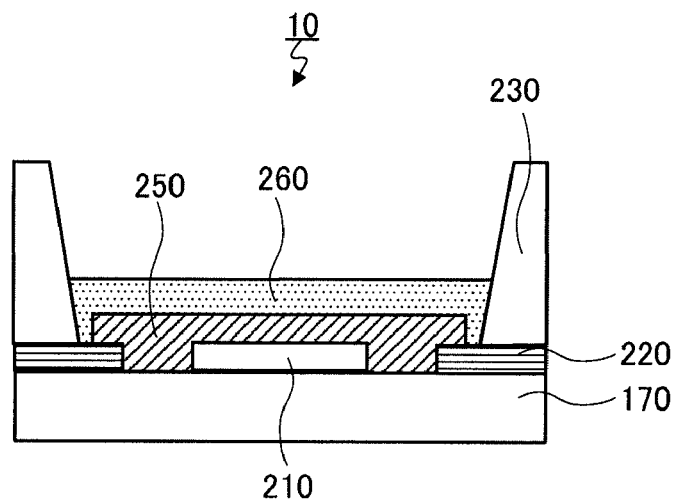

It should be noted that various variations are taken into consideration for configuration of OEL device 10, and a production method may be changed according to the configuration. FIG. 9 is a diagram illustrating a configuration variation of the OEL device.

If insulating inorganic film 220 is set on the hole transport layer (FIG. 9A) or if insulating inorganic film 220 is set on the substrate (FIG. 9B), the production method described above may be used. However if insulating inorganic film 220 is set on the substrate and below the hole transport layer (FIG. 9C), for example, the production process has the step 3) followed by step 2).

In any configuration, insulating inorganic film 220 is provided around the bottom face of the bank and the upper face thereof is in contact with the bottom face of interlayer 260.

As mentioned above in the present embodiment, insulating inorganic film 220 is provided around the bottom face of first bank 230 (or second bank 240) and the upper face thereof is in contact with the bottom face of interlayer 260. There may be such configuration of the OEL device that no interlayer is provided. In this case, insulating inorganic film 220 may only be in contact with the bottom face of polymer OEL material layer 270.

In this way, the layer-thickness uniformity of interlayer 260 or polymer OEL material layer 270 in contact with the upper face of insulating inorganic film 220 is increased.

It should be noted that, the sectional shape of the bank is trapezoidal in FIG. 9 but not limited to that. The sectional shape of the bank may be rectangular. In addition, each side of the cross-section of the bank does not have to be a straight line but may be a curved line.

Embodiment 3

In Embodiment 3, a groove for connecting the adjacent pixel regions with each other is provided at the second bank. With this arrangement, the insulating inorganic film is not provided around the bottom face of the second bank and below the second bank (or particularly around the groove formed at the second bank).

Figure 10:
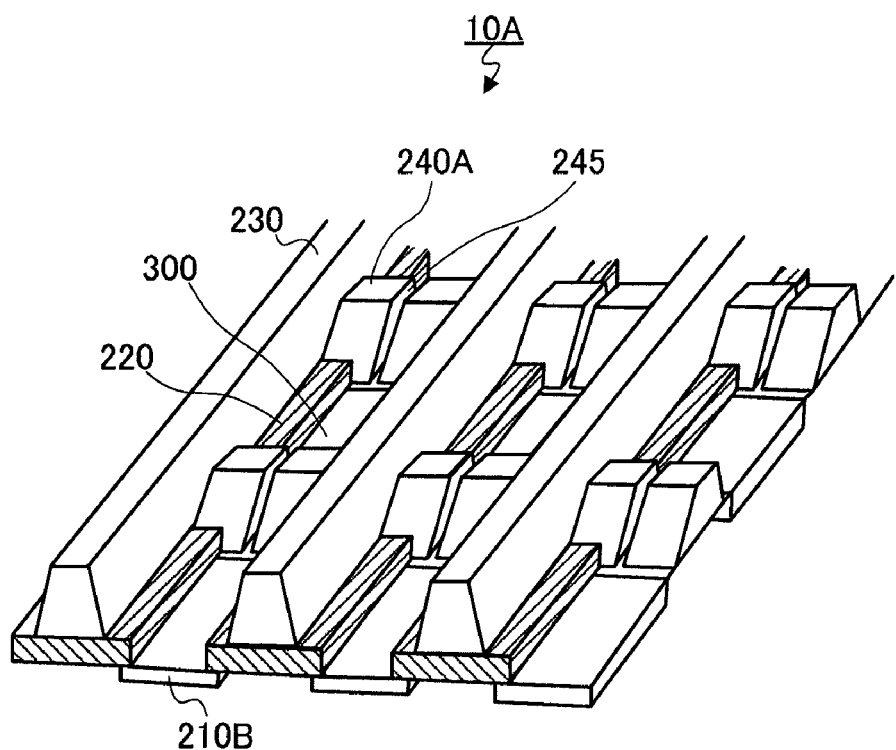
FIG. 10 is a perspective view illustrating configuration of the OEL device according to Embodiment 3.

That is, FIG. 10 is a perspective view illustrating the configuration of the OEL device according to Embodiment 3, and as shown in the figure, OEL device 10A has second bank 240A. At second bank 240A, groove 245 for connecting adjacent pixel regions 300 with each other is formed. In FIG. 10, there is shown a configuration in which a groove is provided at the second bank in the basic configuration of the OEL device according to Embodiment 1 and Embodiment 2.

A preferable value of a width of this groove 245 is different depending on a material of a layer provided in pixel region 300.

If poly (3,4-ethylenedioxythiofen) (referred to as PEDOT) or a derivative thereof (copolymer and the like) is included in the material of the hole transport layer as in Embodiment 1, the width of groove 245 is preferably so large that a solution which is coated to form hole transport layer 250 does not flow into the adjacent pixel regions 300 through groove 245, while a solution which is coated to form interlayer 260 or polymer OEL material layer 270 can flow into the adjacent pixel regions 300 through groove 245.

Usually, PEDOT and the like are applied as a water solution. On the other hand, the constituent materials of interlayer 260 and polymer OEL material layer 270 are dissolved in an organic solvent and applied as an organic solvent solution. The water solution has a viscosity higher than that of the organic solvent solution. Therefore, the preferable width of groove 245 described above is determined by balancing the viscosity of the water solution in which PEDOT and the like are dissolved with the viscosity of the organic solvent solution in which the constituent materials of interlayer 260 and polymer OEL material layer 270 are dissolved.

As mentioned above, by providing second bank 240A, it becomes easy to independently provide hole transport layer 250 to be formed by coating and formed for each pixel region 300.

In addition, groove 245 formed at second bank 240A, fluctuation in brightness in each pixel region 300 is reduced, and then image quality is increased.

That is, interlayer 260 and polymer OEL material layer 270 are formed by applying an organic solvent solution on pixel region 300. In this step, there is a possibility that an application amount of the organic solvent solution on each pixel region 300 may be somewhat fluctuated. The fluctuation in the application amount leads to fluctuation in the brightness of each pixel region 300, which becomes a factor to lower the image quality. In order to cope with such problem, in OEL device 10A according to the present embodiment, by groove 245 connecting two pixel regions 300 that are adjacent to second bank 240A with each other, the organic solvent solution amount in each pixel region 300 is standardized. Therefore, even if a dropped amount of the organic solvent solution is different in each pixel region 300, the fluctuation in the organic solvent solution amount remaining in each pixel region 300 is reduced. As a result, the layer thicknesses of interlayer 260 and polymer OEL material layer 270 is made uniform across pixel regions 300.

On the other hand, if an impurity (dust and the like) is present as mentioned above, there is a problem that the organic solvent solution is attracted to the impurity. However, by setting the width of groove 245 preferable, flow of the organic solvent solution between the adjacent pixel regions 300 is allowed and excessive flow of the organic solvent solution into pixel region 300 where the impurity (dust and the like) is present is suppressed.

On the other hand, if the material of the hole transport layer is a metal oxide such as $WO_x$ (tungsten oxide), $MoO_x$ (molybdenum oxide), $VO_x$ (vanadium oxide) and the like or a combination of them as in Embodiment 2, hole transport layer 250 is not formed by coating, and a function to separate hole transport layer 250 for each pixel region 300 is not included in the functions of second bank 240A. In this case, the functions of second bank 240A can include a function to allow flow of the organic solvent solution in the adjacent pixel regions 300 and a function to suppress excessive flow of the organic solvent solution to pixel region 300 where the impurity (dust and the like) is present.

Embodiment 4

Figure 11:
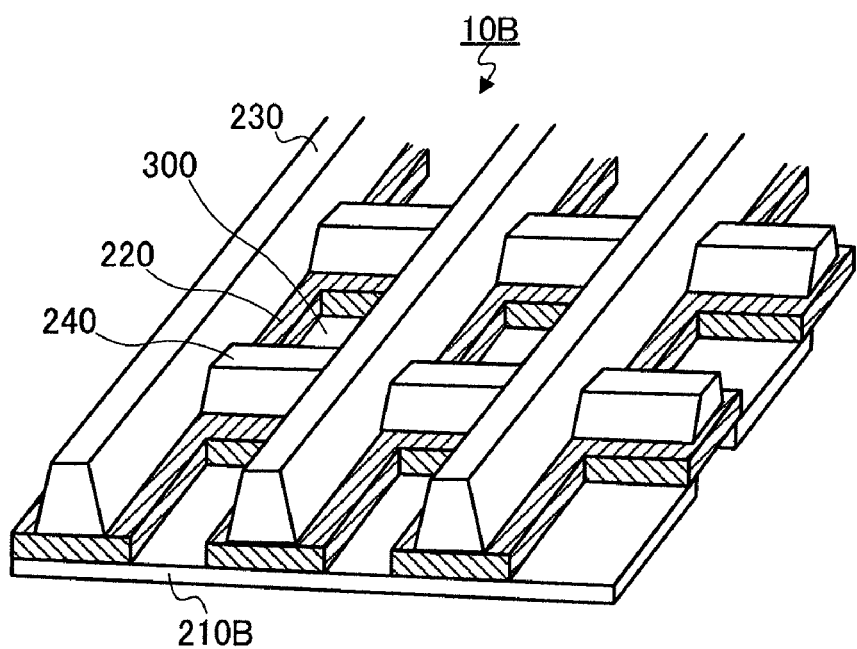
FIG. 11 is a perspective view illustrating configuration of the OEL device according to Embodiment 4.

Embodiment 4 relates to an OEL device with a passive drive system. FIG. 11 is a perspective view illustrating configuration of the OEL device according to Embodiment 4.

In FIG. 11, OEL device 10B to which the passive drive system is applied has band-like anode 210B.

Anode 210B is set on substrate 100, between two second banks 240 and in parallel with second bank 240.

On anode 210, insulating inorganic film 220 is set. On insulating inorganic film 220, first bank 230 is set.

Insulating inorganic film 220 is provided between anode 210 and first bank 230, and functions as an adhesive layer for bonding anode 210 and first bank 230 together.

By providing the adhesive layer between anode 210 and first bank 230, strength of a waffle-shaped structure constituted by first bank 230 and second bank 240 is increased.

Embodiment 5

Figure 12:
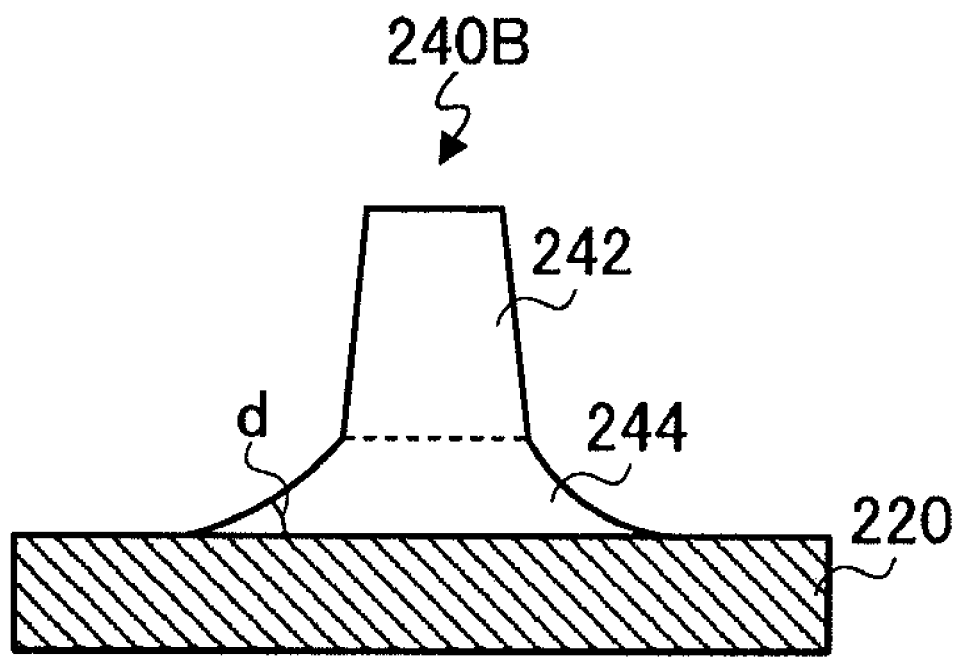
FIG. 12 is a diagram for explaining a variation of a bank sectional shape.

Embodiment 5 relates to a variation of the sectional shape of the bank. FIG. 12 is a diagram for explaining the variation of the sectional shape of the bank.

In Embodiments 1 to 4, the bank with the sectional shape of trapezoidal (or rectangular) was explained. On the other hand, in the present embodiment, a width of a base section of the bank is larger than that of the distal section.

That is, second bank 240B in FIG. 12 is divided to base section 244 on the substrate 220 side and distal section 242. A width of base section 244 is wider than that of distal section 242 and becomes gradually larger toward the base end. In other words, two side surfaces of base section 244 (that is, faces facing pixel regions 300) is separated from each other toward the base end.

As a result, a tapered angle d is made small, and layer-thickness uniformity of the organic light-emitting layer is increased.

In addition, by making the sectional shape of second bank 240B as in the shape described above, a contact area (bonded area) between second bank 240B and the lower layer as well as the first bank is made larger. In this way, strength of the waffle-shaped structure constituted by the first bank and second bank 240B is increased. As a result, since a bank width is designed smaller, a gap between two pixels is reduced and an area for pixel region 300 in the entire OEL device 10 is increased. That is, high definition is promoted and a light-emitting area is increased in OEL device 10.

In the above explanation, only second bank 240B was explained, but by making the sectional shape of the first bank similarly to the shape described above, a similar effect is obtained.

Disclosed contents of descriptions, drawings, and abstracts included in Japanese Patent Application No. 2007-139861 filed on May 28, 2007 and Japanese Patent Application No. 2007-141518 filed on May 29, 2007 are all incorporated herein.

INDUSTRIAL APPLICABILITY

An OEL device and a display of the present invention has increased brightness by increasing a light-emitting area through efficient arrangement of pixel regions while suppressing the interference between the pixel regions. An OEL device and a display of the present invention is suitable for the use not only in OEL television but also in a display section in various electronic equipments including a portable information processor such as a word processor, a personal computer and the like; a watch-type electronic equipment; and others, for example.

The invention claimed is:

1. An organic EL device comprising:
    two or more first banks extending in a line state;
    a plurality of second banks defining pixel regions by dividing a region between adjacent first banks, a height of the second banks being lower than that of the first banks;
    a hole transport layer provided independently for each pixel region; and
    an insulating inorganic film provided on edges of the pixel region, which edges extend along side faces of the two or more first banks facing each other and defining the pixel regions,
    wherein the second banks have a groove connecting the adjacent pixel regions with each other.

2. The organic EL device according to claim 1, wherein the insulating inorganic film is further provided on edges of the pixel region, which edges extend along side faces of the second banks facing each other and defining the pixel regions.

3. The organic EL device according to claim 1, wherein:
    a material of the hole transport layer includes polyethylenedioxythiophene (PEDOT); and
    an upper face of the insulating inorganic film is in contact with a bottom face of the hole transport layer.

4. The organic EL device according to claim 1, wherein:
    a material of the hole transport layer includes tungsten oxide ($WO_x$), molybdenum oxide ($MoO_x$), vanadium oxide ($VO_x$) or a combination of them; and
    the organic EL device further comprises an electron blocking layer in contact with an upper face of the insulating inorganic film, and an organic EL material layer set on the electron blocking layer.

5. The organic EL device according to claim 1, wherein a height of the second banks is $1/10$ to $9/10$ of a height of the first banks.

6. The organic EL device according to claim 1, wherein the second banks have a base section with a width larger than that of a distal section, and the width of the base section becomes gradually larger toward a base end.

7. A display provided with the organic EL device according to claim 1.

* * * * *